US010345379B2

(12) United States Patent
Lujan et al.

(10) Patent No.: US 10,345,379 B2
(45) Date of Patent: Jul. 9, 2019

(54) SCAN TESTING AND METHOD THEREOF

(71) Applicant: NXP USA, Inc., Austin, TX (US)

(72) Inventors: Alexandre Sansigolo Lujan, Campinas (BR); Milton Hissasi Kataoka, Campinas (BR); Rubens Takiguti, Campinas (BR)

(73) Assignee: NXP USA, Inc., Austin, TX (US)

( * ) Notice: Subject to any disclaimer, the term of this patent is extended or adjusted under 35 U.S.C. 154(b) by 128 days.

(21) Appl. No.: 15/817,650

(22) Filed: Nov. 20, 2017

(65) Prior Publication Data

US 2019/0154757 A1 May 23, 2019

(51) Int. Cl.
*G01R 31/28* (2006.01)
*G01R 31/3185* (2006.01)

(52) U.S. Cl.
CPC ........ *G01R 31/318541* (2013.01); *G01R 31/318552* (2013.01)

(58) Field of Classification Search
CPC ............ G01R 31/318541; G01R 31/318552
See application file for complete search history.

(56) References Cited

U.S. PATENT DOCUMENTS

| 6,934,921 | B1 | 8/2005 | Gu et al. |
| 7,409,613 | B2 | 8/2008 | Rich et al. |
| 9,298,572 | B2 | 3/2016 | Ahmed et al. |
| 2003/0097614 | A1* | 5/2003 | Rajski ............. G01R 31/31858 714/30 |

* cited by examiner

*Primary Examiner* — Samir W Rizk

(57) ABSTRACT

An integrated circuit includes clock suppression circuitry that can suppress the launch pulse of an at-speed test to prevent scan test data from propagating from an output of a scan latch through a multi-clock cycle combinational logic path to a downstream scan latch during the at-speed test. The integrated circuit can also suppress the capture pulse of an at-speed test to prevents scan test data that is propagated from an upstream scan latch through a multi-cycle combinational logic path from being latched at the downstream latch during the at-speed test.

20 Claims, 5 Drawing Sheets

SCAN TESTING AND METHOD THEREOF

FIELD OF THE DISCLOSURE

This disclosure relates generally to testing of an integrated circuit, and more particularly, to scan testing of integrated circuits.

BACKGROUND

Scan testing is a test technique that can be used to verify functionality of integrated circuits. Logic Built-In Self-Test (LBIST) is a type of integrated circuit testing that can use scan test techniques to verify operation of an integrated circuit. In LBIST, scan test vectors can be generated by a Pseudo-Random Pattern Generator (PRPG), and responses based on the test vectors are compressed by a Multiple Input Shift Register (MISR) to form a "signature". The signature in the MISR will then be compared with a predetermined signature to determine if there are any defects in the Application Specific Integrated Circuit (ASIC). One obstacle in LBIST design is the presence of multi-cycle propagation and false paths that do not guarantee a specific result will be latched during an at-speed scan test.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

An integrated circuit includes clock suppression circuitry that can suppress either a launch pulse or a capture pulse of a multi-cycle or false propagation path to avoid generation of indeterminate results during an at-speed scan test. For example, a launch pulse of an at-speed scan test can be suppressed at a scan latch that is upstream from functional logic associated with multi-cycle functional logic that has a propagation delay that spans more than one functional clock cycle, or a false path. The clock suppression circuitry further can alternatively suppress a capture pulse of the at-speed scan test from being provided to a scan latch that is downstream from multi-cycle or false path functional logic. Suppression of the launch and capture pulses ensures determinant scan results, as will be better understood with reference to FIGS. 1 through 5.

Figure 1:
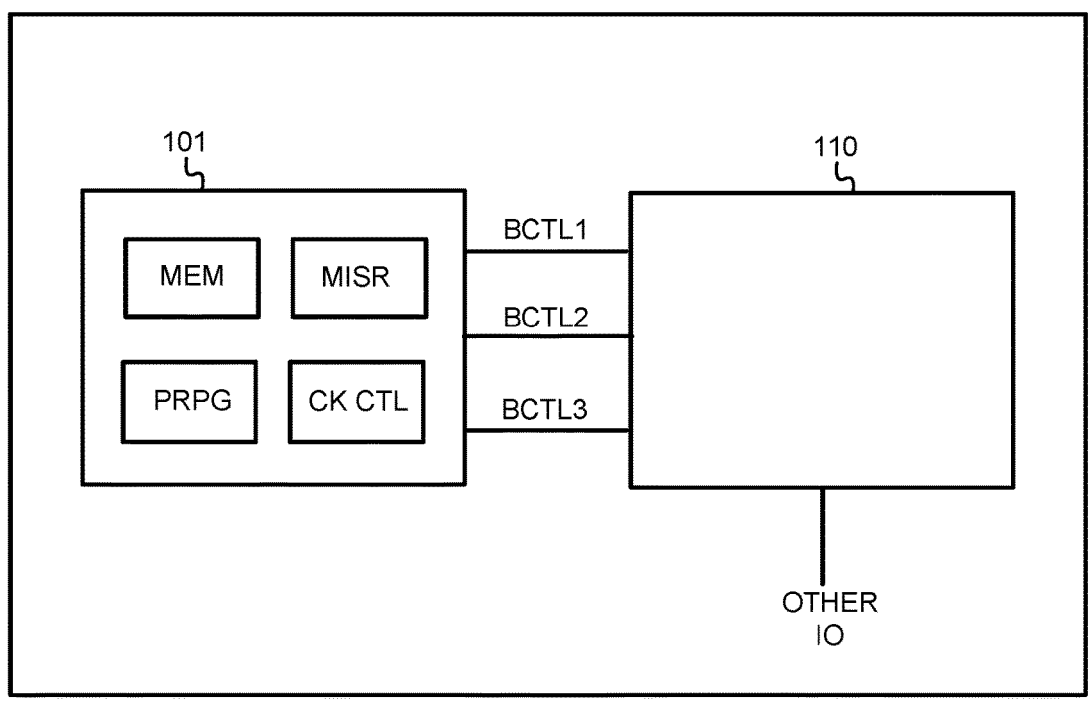
FIG. 1 is a simplified illustration of a device having built-in self-test circuitry according to exemplary embodiments.

FIG. 1 is a block diagram of a device that includes an integrated circuit device 100, such as a semiconductor-based die, packaged device, end-user device, and the like. The integrated circuit device 100 includes an application logic portion 110, and a LBIST logic portion 101 that can test the application logic portion. According to an embodiment, the LBIST 101 can test different portions of the application logic 110 differently. For example, one portion of the application logic 110 can be associated with a first scan chain that is tested using the set of LBIST control interconnects labeled BCTL1, another portion can be associated with a second scan chain that is tested using the set of LBIST control interconnects labeled BCTL2, and yet another portion can be associated with a third scan chain that is tested using the set of LBIST control interconnects labeled BCTL3. For purposes of discussion, it is presumed each set of LBIST control interconnects includes those interconnects that interface with a specific scan chain to communicate information during scan testing, including: a scan enable signal, a scan test enable signal, a data input signal, a data output signal, and a clock signal.

During LBIST operation, seed values stored in memory (MEM) of the LBIST 101 can be used by a pseudo-random pattern generator (PRPG) to generate a fixed sequence of binary values that can be used as test input data, referred to as scan test vectors, to test the application logic 110. The clock controller (CK CTL) of the LBIST 101 can control the period of pulses used to shift data into and out of a scan chain, as well as the period of pulses used for at-speed testing of the application logic itself. Results from the scan tests are verified by the analyzer of the LBIST 101, which can include a Multiple-Input Shift Register (MISR).

Figure 2:
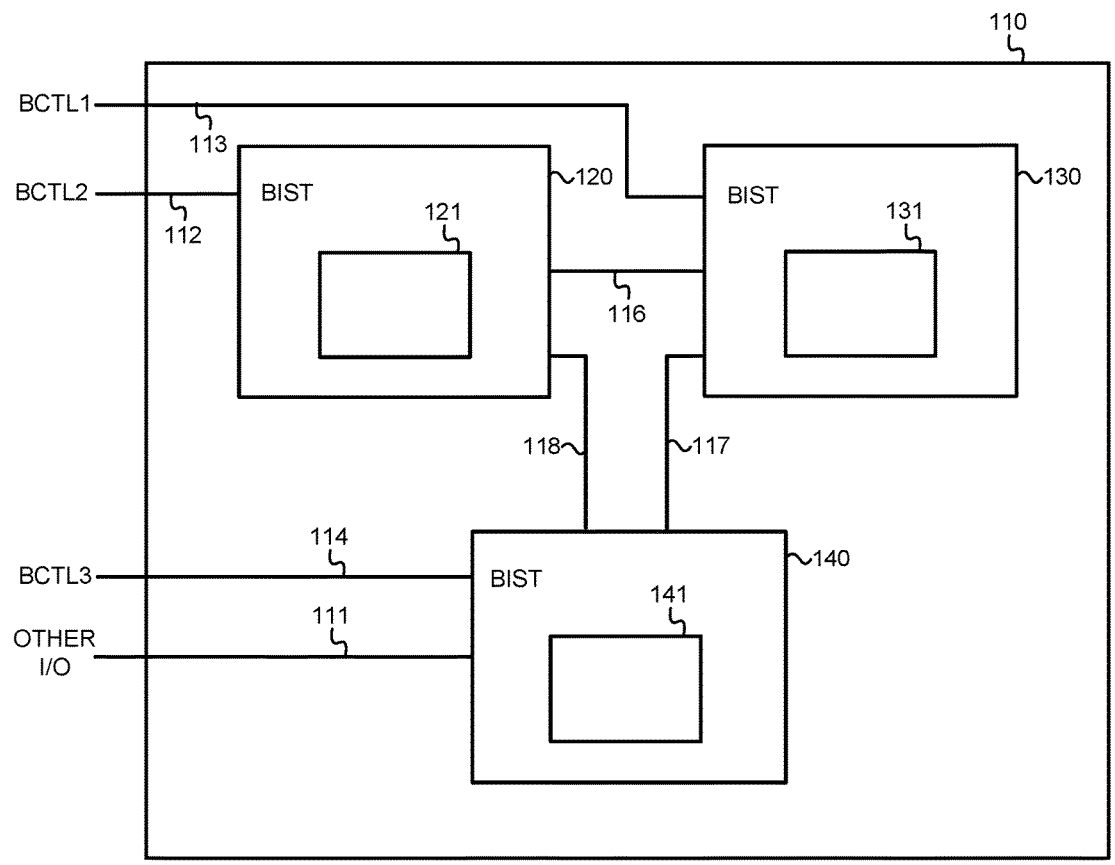
FIG. 2 is a more detailed illustration of portions of the built-in self-test circuitry of FIG. 1 according to exemplary embodiments.

FIG. 2 illustrates a more detailed embodiment of the application logic 110, and includes logic portions 120, 130, and 140. Each one of the logic portions 120, 130, and 140 is associated with its own set of LBIST control interconnects BCTL1, BCTL2, and BCTL3, respectively. In addition, each one of the logic portions 120, 130, and 140 is illustrated to have respective clock suppression logic 121, 131, 141 that can be used to facilitate LBIST testing as-described herein. It will be appreciated that the clock suppression logic 121, 131, and 141 can be considered part of the LBIST logic portion 101, but is shown with the individual application logic portions for convenience.

Each logic portions' LBIST control interconnects (BCTL1-BCTL3) can include a SCAN_IN terminal to receive scan data, a SCAN_EN terminal to receive a scan enable signal, a SCAN_OUT terminal from which scan data can be provided to the LBIST analyzer for verification, an LBIST_EN signal that is enabled during LBIST testing to facilitate the use of the suppression logic of each logic portion, and a CK signal. According to an embodiment, the partitioning of the logic portions 120, 130, and 140 can be by virtue of the various logic belonging to different clock domains, by virtue of their having different timing requirements, by virtue of required number of scan chains, by virtue of size, by virtue of physical isolation for safety applications, by virtue of power domain, by virtue of standard cell types by virtue of other considerations, and combinations thereof.

Figure 3:
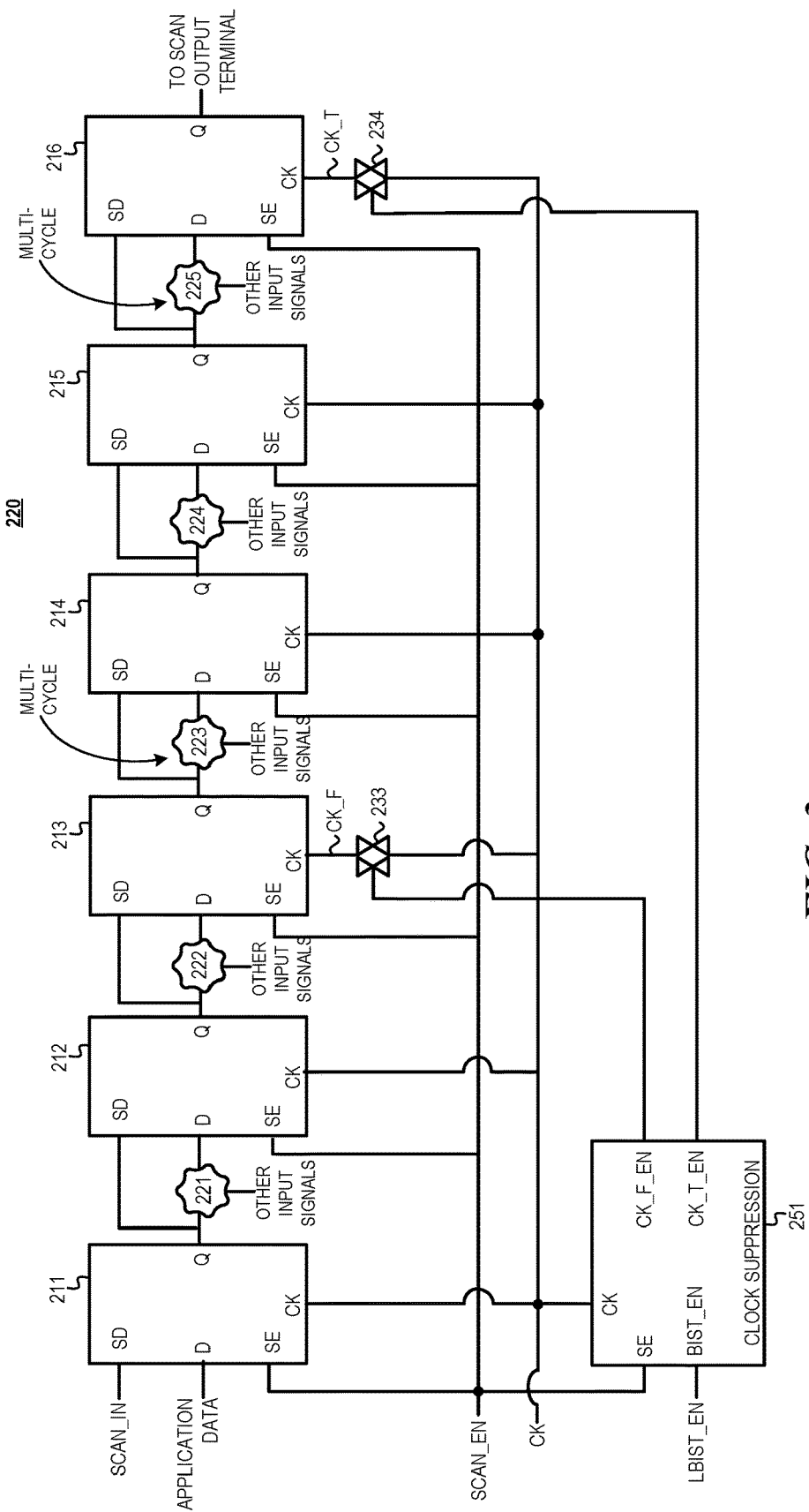
FIG. 3 is a more detailed illustration of a portion of FIG. 2 according to exemplary embodiments.

FIG. 3 illustrates a logic portion 220 that for ease of discussion is presumed to be representative of an embodiment of logic portion 120 that forms a scan chain. It will be appreciated, however, that FIG. 3 can also be representative of any of the other logic portions. FIG. 3 illustrates scan latches 211 through 216, combinational logic portions 221-225, pass gate 233, pass gate 234, and a clock suppression circuit 251. Each scan latch includes a scan data input (SD), a data input (D), a scan enable input (SE), a clock input (CK), and a data output (Q). It will be appreciated that a scan chain having six scan latches is shown for convenience, and that typically there will be more latches in a scan chain.

Input SD of scan latch 211 is connected to a SCAN_IN terminal to receive scan-in data, which can be provided serially from scan test equipment or from LBIST 101. Input D of scan latch 211 can be referred to as an application data input by virtue of being connected to receive application data during application processing. Input SE of scan latch 211 is connected to a SCAN_EN terminal receiving a scan enable signal. Input CK of scan latch 211 is connected to receive a clock signal CK via terminal CK. It will be appreciated that the clock signal CK is an ungated clock signal relative to the illustrated scan chain. Output Q of scan latch 211 is connected to combinational logic portion 221, which is application logic used to process application data during application processing. Combinational logic portion 221 can be connected to receive input signals from other scan latch outputs and to provide output signals to other scan latch inputs.

Input CK of scan latch 212 is connected to the clock terminal to receive a clock signal. Input SE of scan latch 212 is connected to receive the scan enable signal from terminal SCAN_EN. Input SD of scan latch 212 is connected to receive scan-in data from output Q of scan latch 211 during scan testing. More specifically, the sequence of latches forming a scan chain defined by the Q-to-SD connections is used in the shift phase of the scan test when SCAN_EN is asserted to load a test vector. It will be appreciated that the illustrated scan chain connection from output Q of scan latch 211 to input SD of scan latch 212 is just an example, and that an output Q from any latch of the scan chain can be connected to an input SD of any other latch of the scan chain, as long as the resulting Q-to-SD connections includes all scan latches so that information at the SD input of each latch of the scan chain is latched during each clock cycle.

Input D of scan latch 212 is connected to an output of combinational logic 221. During normal operation, e.g., when an end-user application is being executed, the information at input D is application data that has been processed by the combinational logic 221. During scan testing, signal LBIST_EN is asserted, then-a test vector has been loaded, and SCAN_EN is negated, the information at terminal D is scan test result data that is processed by the combinational logic 221 to generate a scan test result that can be shifted from the scan chain for verification, by asserting SCAN_EN. Terminal Q of scan latch 212 is connected to an input of combinational logic portion 222. Combinational logic portion 222 can be further connected to receive other input signal from other output terminals, and to provide output signals to other input terminals.

As used herein, the term "downstream in a scan chain," and its variants, as used with reference to one of two scan latches is intended to refer to the latch having its scan data (SD) input connected to the output (Q) of the other latch, and the term "functionally downstream," and its variants, as used herein with reference to one of two latches is intended to refer to a latch having its data (D) input connected to combinational logic that receives input information from the output Q of the other latch. Therefore, scan latch 212 is downstream in the scan chain from latch 211, and is also functionally downstream from latch 211. As discussed previously, it is not necessary for a latch downstream in a scan chain from another latch to also be functionally downstream from that latch, though for convenience, each of latches 211-216 is shown as downstream in the scan chain and downstream functionally from a common respective latch.

Input SD of scan latch 213 is connected to receive scan-in data from output Q of scan latch 212. Input D of scan latch 213 is connected to an output of combinational logic 222, which provides application information during normal operation and test result information during a test portion of scan testing. Input SE of scan latch 213 is connected to receive a scan enable signal from terminal SCAN_EN. Input CK of scan latch 213 is connected to a first data terminal of pass gate 233 to receive a gated clock signal labeled CK_F, that can also be referred to as a "from-clock" (CK_F). It will be appreciated that the clock signal CK is ungated relative the first data terminal of pass gate 233, and that the clock signal CK_F is a gated clock signal. A second data terminal of the pass gate 233 is connected to terminal CK. Output Q of scan latch 213 is connected to an input of combinational logic portion 223. Combinational logic portion 223 can be further connected to receive other input signal from other output terminals, and to provide output signals to other scan latch inputs.

Input SD of scan latch 214 is connected to received scan-in data from output Q of scan latch 213. Input D of scan latch 214 is connected to an output of combinational logic 223 to receive application information during normal operation, and test result information that is scanned out serially during an output portion of scan testing. Input SE of scan latch 214 is connected to receive a scan enable signal from terminal SCAN_EN. Input CK of scan latch 214 is connected to the clock terminal CK to receive an ungated clock. Output Q of scan latch 214 is connected to combinational logic portion 224. Combinational logic portion 224 can be further connected to receive other input signal from other output terminals, and to provide output signals to other scan latch inputs.

Input SD of scan latch 215 is connected to receive scan-in data from output Q of scan latch 214 during scan testing. Input D of scan latch 215 is connected to an output of combinational logic 224, which is application information during normal operation and test result information that is scanned out serially during an output portion of scan testing. Input SE of scan latch 215 is connected to receive a scan enable signal from terminal SCAN_EN. Input CK of scan latch 215 is connected to receive an ungated clock signal from a terminal CK. Terminal Q of scan latch 215 is connected to an input of combinational logic portion 225. Combinational logic portion 225 can be further connected to receive other input signal from other output terminals, and to provide output signals to other scan latch inputs.

Input SD of scan latch 216 is connected to receive scan-in data from output Q of scan latch 215. Input D of scan latch 216 is connected to an output of combinational logic 225, which provides application information during normal operation and test result information during a test portion of scan testing. Input SE of scan latch 216 is connected to receive a scan enable signal from terminal SCAN_EN. Input CK of scan latch 216 is connected to a first data terminal of pass gate 234 to receive a gated clock signal labeled CK_T, that can also be referred to as a "to-clock". It will be appreciated that the clock signal CK_T is gated relative the CK signal received at the second data terminal of the pass gate 233 that is connected to terminal CK. Output Q of scan latch 216 is connected to a scan output terminal.

Clock suppression logic-251 includes an input SE connected to receive the signal SCAN_EN, an input CK to receive a signal CK, an input LBIST_EN to receive a scan test enable signal having the same label, an output CK_F_EN connected to a control node of pass gate 233 to provide an enable signal, and an output CK_T_EN connected to a control node of pass gate 234 to provide an enable signal. It will be appreciated that for ease of discussion that physical connection and the signal transmitted via the physical connection can be referred to using the same label.

During normal operation, e.g., when application data is being processed and scan testing is, therefore, not being performed, signals LBIST_EN and SCAN_EN are negated, which by way of example is presumed herein to refer to a logic-level low signal. In response to LBIST_EN being negated, the respective signals provided at outputs CK_F_EN and CK_T_EN of clock suppression logic 251 are asserted, thus, allowing all pulses of the signal CK to pass through clock gates 233 and 234 to the CK input of scan latches 213 and 216, respectively, e.g., no pulses are suppressed. Also during normal operation, by virtue of signal SCAN_EN being negated, the information at each scan latch's data input, D, will be latched at its corresponding Q output by pulses of signal CK. The latched logic values are provided to one or more of the combinational logic portions 221-225 to generate the logic values at one or more downstream D inputs of the scan latches 212-216. By way of example, it is presumed that data is latched by each scan latch in response to rising edges at their CK inputs.

Combinational logic connected to a D input of a scan latch can be implemented using either a single-cycle clock propagation path or a multi-cycle clock propagation path. Combinational logic implementing a single-cycle clock path is designed to ensure that during application processing that there is sufficient time between latching edges of adjacent application clock pulses, e.g., between rising clock edges, to allow a signal at the output Q of a scan latch to fully propagate to the D input of its downstream scan latch. Combinational logic having a multi-cycle clock cycle paths are not designed to guarantee sufficient time between adjacent rising clock pulses for output signals to fully propagate to the D input of downstream latches in a single clock cycle, but instead, the logic result of a multi-cycle clock path takes more than one clock cycle to become fully resolved. By way of example, it is presumed herein that multi-cycle logic paths take two clock cycles to be resolved, that combinational logic portions 221, 222, and 224 are single-cycle clock paths, and that combinational logic portions 223 and 225 are multi-clock cycle path.

Figure 4:
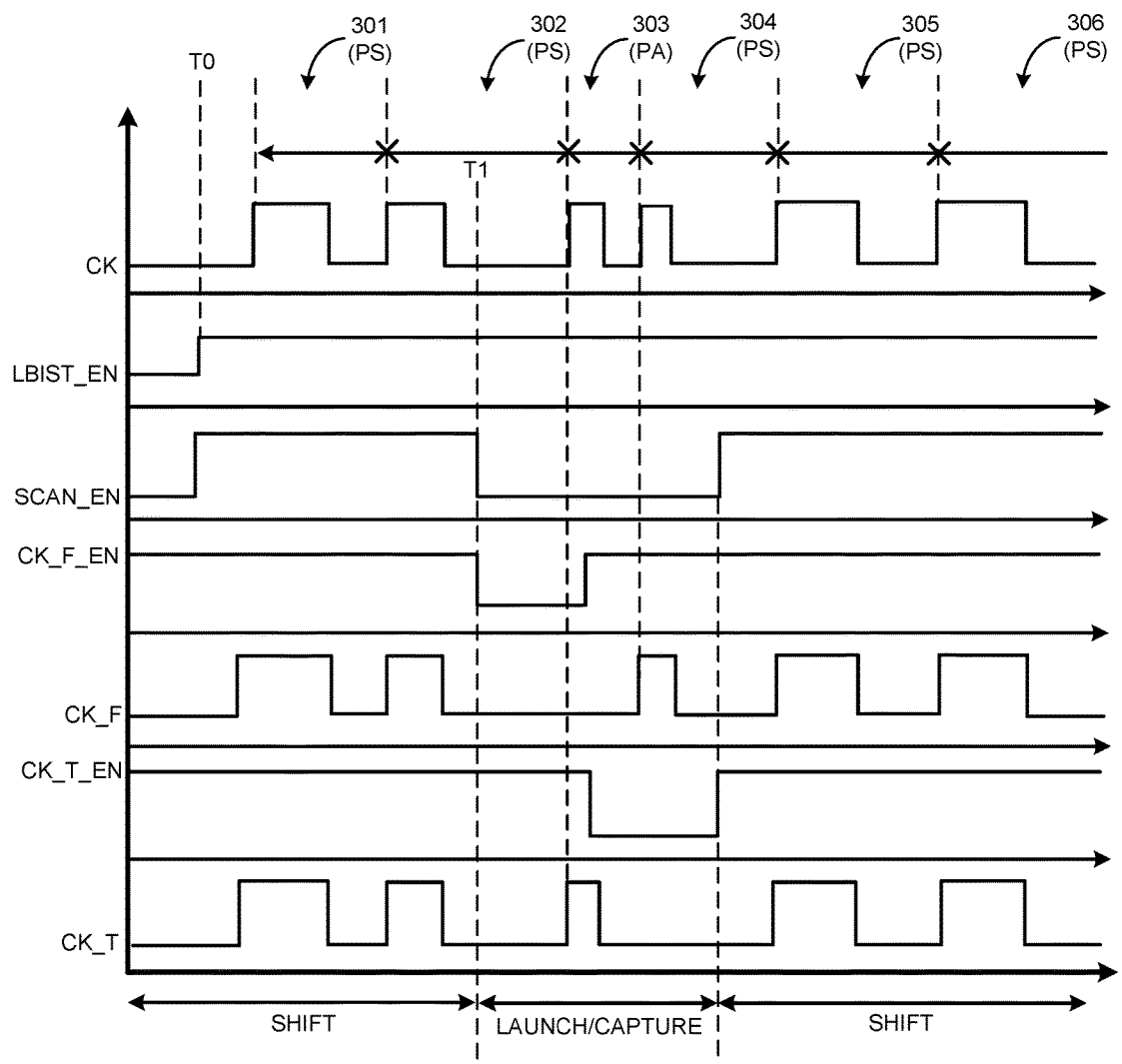
FIG. 4 is a timing diagram of the built-in self-test circuitry according to exemplary embodiments.

In response to the LBIST controller asserting both the LBIST_EN and SCAN_EN signals, the device 100 enters a shift phase of a scan test operation, as indicated at T0 of FIG. 4. During the shift phase, assertion of SCAN_EN causes the SD input of each of the scan latches 211-215 to be selected as its Q output data source instead of the information at its functional data input (D). This allows a scan test vector to be serially shifted through the scan chain with each scan clock. Only two shift phases, 301 and 302, are shown. Also during shift phase, when SCAN_EN and LBIST_EN are asserted, the clock suppression circuit 251 does not suppress pulses to any of the scan latches, and, therefore, asserts signals at signals CK_F_EN and CK_T_EN, allowing all clock pulses to pass through pass gates 233 and 234 to signal CK_F and CK_T, respectively. According to an embodiment, the CK signal has a scan period (Ps) during the scan shift phase of scan testing that is slower than the application period (Pa) that is provided during normal operation. Such a lower clock rate can be needed to reduce the rate at which power is consumed during scan testing. For example, an application period can correspond to a frequency of 500 MHz or greater, while the shift period corresponds to a frequency in the range of 25 MHz. During the shift phase of the scan test, a binary sequence of scan test data, which can be referred to as a scan test vector, is shifted into the scan chain. For purposes of discussion, it is presumed that scan test data is latched on the rising edge of each clock pulse.

Scan test vectors that are used to perform logic verification are capable of detecting combinational logic having stuck-at faults, while scan test vectors that are used to perform timing verification, e.g., at-speed testing, are capable of detecting combinational logic having transition delay faults.

During traditional logic verification, that does not use the clock suppression technique described herein, once the scan test vector is latched into the scan chain, e.g., the test vector is at the SD input of the scan latches, the SCAN_EN signal is negated and a single capture pulse is asserted to latch a logical scan result vector that is at the D inputs of the scan latches. For example, after LBIST has loaded a logic test vector into the scan chain, a single clock pulse is asserted while the signal SCAN_EN is negated, allowing the functional data at each one of the D inputs of the scan chain to be latched. This pulse can be referred to as the capture pulse of the logic test. After the functional data is latched, the signal SCAN_EN is asserted prior to a sequence of clock pulses that shift the logic test scan result out of the scan chain for analysis. It will be appreciated that, during logic testing, sufficient time needs to elapse prior to latching the information at the D inputs of the scan chain to ensure each of combinational logic portions 221-225 have fully transitioned. This requires time period that is longer than the worst-case application logic propagation path between the scan flops, including multi-cycle clock propagation paths. Thus, in the present logic test example, the scan in clock period needs to be longer than the worst-case delay through the logic portion 223 and 225, which are a multi-clock cycle propagation path relative the period of the application clock.

For at-speed testing, once the scan test vector has been scanned into the scan chain, e.g., the test vector is at the SD inputs of the scan latches, and a stable logical value is at each D input of the scan latches, the SCAN_EN signal is negated and two functional clock pulses are provided, the first being referred to as a launch pulse and the second being referred to as a capture pulse. For example, after LBIST module 101 has latched the last bit of a logic test vector into the scan chain, the signal SCAN_EN is negated, and sufficient time is allowed to ensure each bit of the test vector has propagated through each of logic portions 221-225 to provide stable values at the D inputs before a first functional clock pulse.

The first pulse asserted after SCAN_EN is negated, e.g., the launch pulse of the at-speed test, will cause the at-speed test vector, e.g., the information at the input (D) of each scan latch, to be latched and presented at its output (Q), unless suppressed by clock suppression circuitry 251. This causes the at-speed test data to begin propagating from the Q output of each upstream scan latch to the data (D) input of each downstream scan latch through a corresponding combinational logic portion. In FIG. 4, the launch pulse is the pulse of signal CK that is associated with period 303, e.g., the pulse having a rising edge coincident with the beginning of period 303, which is also the initial clock pulse after SCAN_EN is negated while LBIST_EN remains asserted. The second pulse, e.g., the capture pulse, occurs at a predetermined amount of time after the first pulse that is sufficiently long to meet a worst case propagation delay of the single-clock cycle combinational logic portions, and causes the result from the capture pulse to be latched, unless otherwise suppressed. Thus, the capture pulse latches an at-speed result vector at the scan latches' D inputs. This result vector is then scanned out and analyzed to verify proper transition of each signal through its respective delay path. In FIG. 4, the capture pulse is the pulse associated with period 304, e.g., the pulse having a rising edge coincident with the beginning of period 304.

As discussed previously, the duration of the application clock period (PA), which includes the duration of period 303, is selected based upon the worst case propagation delay of the single-clock cycle combinational logic portions, and corresponds to a time during which the delay paths of all single-cycle clock combinational logic portions are expected to have stable values. Combinational logic portions that are slower than expected, can latch an incorrect result value during the capture cycle, which, when shifted out of the scan chain for analysis, will be identified as an at-speed timing error. Traditional scan test systems that apply the launch and capture clocks to every latch of a scan chain will result in indeterminate logic values being latched by latches downstream from a multi-clock cycle logic portion. For example, absent the techniques described herein, an indeterminate value will be latched at latch 214 and latch 216 by virtue of their upstream logic portions 223 and 225 being multi-clock cycle logic portions. To accommodate indeterminate results from multi-clock cycle paths, traditional scan test systems analysis of the scan results mask result bits that can be indeterminate due to a multi-cycle clock delay path. While masking result data that can be indeterminate allows for at-speed verification of the single-clock cycle logic portions, no useful information, such as logic data that can be used for logic verification, is provided about the multi-clock cycle logic portions.

The clock suppression logic 251 of the present disclosure can be used during at-speed testing to ensure all bits of a result vector latched from multi-clock cycle logic portions are determinant. This is achieved by suppressing either the launch pulse of a scan latch that is upstream from a multi-cycle clock logic portion, or suppressing the capture pulse of a scan latch that is downstream from the multi-cycle clock logic portion. As will be better understood with reference to the timing diagram of FIG. 4, the clock suppression logic 251 ensures determinant results at latch 214 during at-speed testing by suppressing the launch pulse associated with the upstream latch 213, and ensures determinant results at latch 216 during at-speed testing by suppressing the capture pulse associated with the downstream latch 216.

As illustrated at FIG. 4, both the LBIST signal and the SCAN_EN signal are asserted at time T0 to begin a scan test operation that begins with a plurality of shift cycles, which include cycles 301 and 302, during a test vector is scanned into the scan latch. Prior to cycle 303, at time T1, the signal SCAN_EN is negated, allowing functional data at the D inputs of the scan latches to be subsequently latched. The CK pulse at cycle 303 is a launch pulse, while the CK pulse at cycle 304 is a capture pulse. A signal CK_F_EN is generated by the clock suppression logic 251 that controls a clock gate 233 to suppress the launch pulse of signal CK_F, received at scan latch 213, during cycle 303. A signal CK_T_EN is also generated by the clock suppression logic 251 that controls a clock gate 234. All other latches receive an ungated clock, e.g., receive clock signal CK directly, and therefore receive both the launch and capture pulses during at-speed testing.

The launch pulse of cycle 303 causes each of latches 211, 212, and 214-215 to latch the data at their respective D inputs, which begins a signal propagation through each of their respective logic portions 221, 222, 224, and 225. Because the launch pulse of cycle 303 is suppressed in signal CK_F, received by latch 213, no new data is propagated through the multi-cycle clock logic portion 223 during cycle 303, consequently the value at the D input of latch 214 is not affected by the multi-cycle path. However, the 214 D input is still subject to influence of the "OTHER INPUT SIGNALS" set of signals. Such signals influence is beneficial in that it allows testing those paths and associated logic.

Next, the capture pulse of cycle 304 causes each of latches 211-215 to latch the data at their respective D inputs. Because no new information was latched at the output of scan latch 213 during cycle 303, the capture pulse of cycle 404 will result in latch 214 latching the same value in cycle 304 as was latched in cycle 303, thus avoiding an indeterminate value in the scan result due to the multi-cycle logic path 223. Latching of an indeterminate value is also avoided at latch 216, even though new data began propagating through combinational logic portion 225 in response to the launch pulse, by suppressing the capture pulse of signal CK_T at latch 216 in cycle 304. After the capture pulse is asserted, and before the clock pulse of cycle 305, the signal SCAN_EN is asserted, thus selecting the SD input of each latch for latching by subsequent shift pulses.

After assertion of the SCAN_EN signal, the scan test again enters a shift phase during which a scan result vector is scanned out for analysis. For example, the scan result vector can be provided to the MISR of FIG. 1, which determines a result signature based upon the scan result vector that can then be analyzed to determine whether a scan chain failure has occurred. For example, the signature can be compared to an expected signature to determine if the at-speed test was successful.

Figure 5:
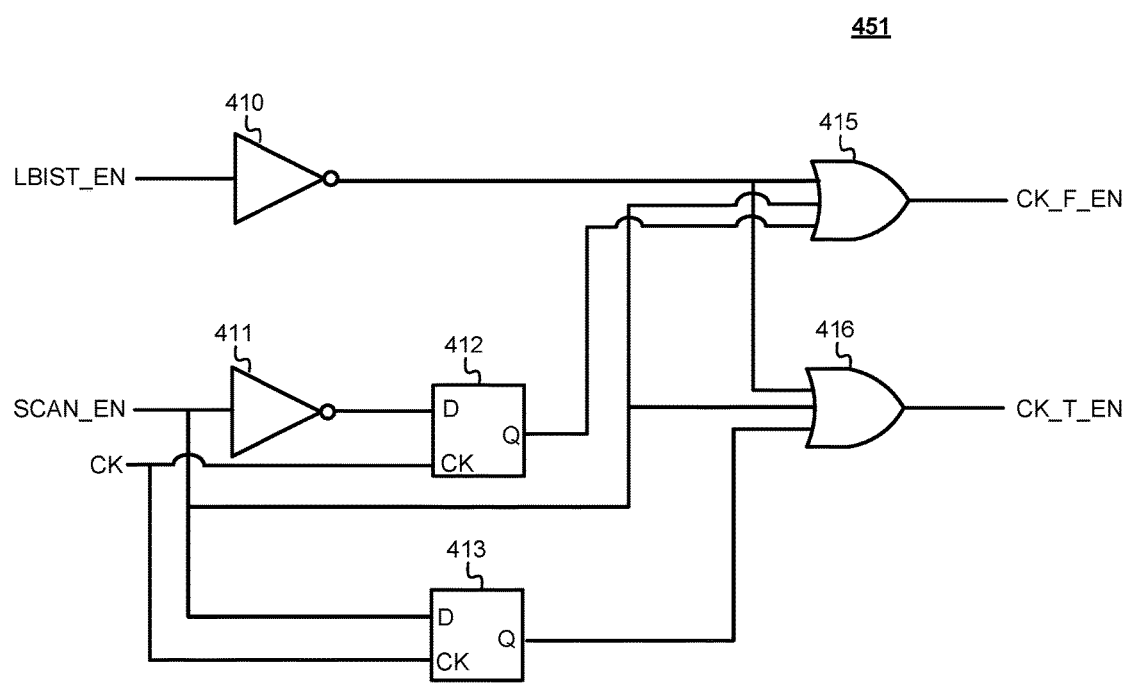
FIG. 5 is a simplified illustration of a clock suppression circuit according to exemplary embodiments.

FIG. 5 illustrates a clock suppression circuit 451 illustrating a specific embodiment of implementing the clock suppression circuitry 251. Clock suppression circuitry 451 includes inverters 410 and 411, data flip-flops 412 and 413, and three-input OR gates 415 and 416. Inputs of the three-input OR gate 415 are connected to the output of inverter 410, the output of data flip-flop 412, and the SCAN_EN terminal. Inputs of the three-input OR gate 416 are connected to the output of inverter 410, the output of data flip-flop 413, and the SCAN_EN terminal. The data input of the data flip-flop 412 is connected to the output of inverter 411, and the clock input of the data flip-flop 412 is connected to the CK terminal. The data input of the data flip-flop 413 is connected to the input of inverter 411, and the clock input of the data flip-flop 412 is connected to the CK terminal. The input of inverter 410 is connected to the LBIST_EN terminal. The input of the inverter 411 is connected to the SCAN_EN terminal. It will be appreciated, that the implementation of clock suppression circuit 451 is but one of many ways of implementing the logic diagram of FIG. 3, and that conventional automated synthesis tools can be used to implement corresponding circuitry.

It will also be appreciated that it's common to define multi-cycles paths of a particular design based on circuit characteristics. For example, knowing that a group of latches will always capture data from multi-cycle paths, then it could be enough to suppress the capture pulses to meet the LBIST testing requirement. In such a case it would not be necessary to suppress the launch pulse to this group of latches. Extending this scenario, if the amount of capture latches is greater than the amount of launch latches, then it could be convenient to suppress the launch pulses only, because the modified clock signal will be routed to a reduced number of latches. In summary, the decision on suppressing the launch pulse or the capture pulse, only, or both launch and capture pulses depends on circuit characteristics.

In a first aspect, a method can include providing a first clock signal having a plurality of pulses, including a first set of pulses having a first period, followed by a first launch pulse having a second period that is different than the first period, followed by a first capture pulse having a third period, followed a second set clock pulses having the first period. Shifting a first scan test vector into a first scan chain based on the first set of pulses. Suppressing the first launch pulse of the first set of pulses to a first latch of the first scan chain. Providing the first launch pulse of the first set of pulses to a second latch, a third latch, and a fourth latch of the first scan chain, wherein the second latch is functionally downstream from the first latch, and the fourth latch is functionally downstream from the third latch; Suppressing the first capture pulse of the first set of pulses to the fourth latch; Providing the first capture pulse of the first set of pulses to the first latch, the second latch and the third latch. And, Shifting a scan result vector from the first scan chain, after suppressing the first capture pulse, based on the second set of pulses.

In one embodiment of the first aspect, the second period is shorter than the first period. In another embodiment of the first aspect, the first period and the third period of the first pulse are the same, and the second period is shorter than the first and third period. In a more particular embodiment, the another embodiment further comprises analyzing the scan result vector to determine whether a scan chain failure has occurred. In an even more particular embodiment, analyzing includes generating a result signature based upon the plurality of scan result bits, and comparing the result signature to an expect signature. In still an even more particular embodiment, the even more particular embodiment includes performing the analyzing on a semiconductor die that includes the first scan chain.

A further embodiment of the first aspect includes shifting the first scan test vector includes selecting a scan input of each latch of the first scan chain during the shifting by asserting a scan data enable signal. In a more particular embodiment of the further embodiment, suppressing the first launch pulse and suppressing first capture pulse in the further embodiment is in response to maintaining the scan data enable signal being in a negated state during the first launch pulse and the first capture pulse. An even more particular embodiment of the more particular embodiment includes selecting an application data input of each latch of the first scan chain while providing the first launch pulse and the first capture pulse in response to negating the shift scan data enable signal. Another even more particular embodiment of the more particular embodiment includes further comprising providing an asserted test enable signal during the plurality of pulses.

In a second aspect, a device comprises a first scan chain having a first plurality of scan latches, each scan latch of the first scan chain including a scan enable input, an application data input, a scan data input, a clock input, and a data output, the scan enable input of each scan latch of the first scan chain connected to a first scan enable terminal. And, a first clock suppression circuit having a scan enable input coupled to the first scan enable terminal, a first output coupled to the clock input of a first scan latch of the first scan chain to suppress an initial clock pulse at the clock input of the first scan latch after a scan enable signal at the first scan enable terminal is negated, and to allow a next clock pulse, after the initial clock pulse, to occur at the clock input of the first scan latch, and a second output coupled to the clock input of a second scan latch of the first scan chain to allow the initial clock pulse at the clock input of second scan latch after a scan enable signal at the scan enable input is negated, and to suppress the next clock pulse at the clock input of the second scan latch.

One embodiment of the second aspect further includes a second scan chain having a second plurality of scan latches, each scan latch of the second scan chain including a scan enable input, an application data input, a scan data input, a clock input, and a data output, the scan enable input of each scan latch of the second scan chain connected to a second scan enable terminal. And a second clock suppression circuit having a scan enable input coupled to the second the scan enable terminal, a first output coupled to the clock input of a first scan latch of the second scan chain to suppress an initial clock pulse at the clock input of the first scan latch after a scan enable signal at the second scan enable terminal is negated, and to allow a next clock pulse, after the initial clock pulse, to occur at the clock input of the first scan latch of the second scan chain, and a second output coupled to the clock input of a second scan latch of the second scan chain to allow the initial clock pulse at the clock input of a second scan latch of the second scan chain after a scan enable signal at the second scan enable input is negated, and to suppress the next clock pulse at the clock input of the second scan latch of the second scan chain.

In another embodiment of the second aspect, the clock suppression circuit further includes a test enable input, and the initial clock pulse is further allowed and suppressed at the first and second scan latches of the first scan chain, respectively, and the next clock pulse is further suppressed and allowed at the first and second scan latches of the first scan chain, respectively in response to the test enable signal being asserted while the first scan enable input is negated.

In a further embodiment of the second aspect, the duration between the first launch pulse and the first capture pulse defines a worst-case propagation delay of an at-speed test of a combinational logic portion of the first scan chain.

In yet a further embodiment of the second aspect, the device further includes built-in self test circuitry to generate a shift clock signal having a first plurality of pulses with a first period that are used to shift predefined test data into the first scan chain, followed by the initial clock pulse having a second period and the next pulse having a third period that generate a test result at the scan chain, followed by a second plurality of pulses with the third period that are used to shift test result data from the scan chain, the second period being shorter than the first period and the third period. In a more particular embodiment of the yet further embodiment, the built-in self-test circuitry further includes analyzer circuitry that receives the test result data to determine whether the result data meets an expected criteria. In another more particular embodiment of the yet further embodiment, the second period provided by the built-in self-test circuitry is shorter than the third period.

In a third embodiment, a device includes a first scan chain having a first plurality of scan latches including a first scan latch and a second scan latch, each scan latch including a scan enable input, an application data input, a scan data input, a clock input, and a data output, the scan enable input of each scan latch of the first plurality of scan latches coupled to a first scan enable terminal, the second scan latch being downstream from the first scan latch. A first clock terminal coupled to provide an ungated clock signal to the clock inputs a first portion of the first scan chain. And, a first clock suppression circuit having a clock input coupled to the first clock terminal to receive the ungated clock signal, a first inverters having an input coupled to the scan enable terminal, and an output, a first latch having a data input coupled to the output of the first inverter, a clock input coupled to the first clock terminal to receive the ungated clock signal, and a clock enable output, a second latch having a data input coupled to the input of the first inverter, a clock input coupled to the first clock terminal to receive the ungated clock signal, and a clock enable output, a first clock gate having a clock input coupled to the first clock terminal to receive the ungated clock, a clock output coupled to the clock input of the first latch, and an enable input coupled to the first clock enable output of the first latch, and a second clock gate having a clock input coupled to the first clock terminal to receive the ungated clock, a clock output coupled to the clock input of the second latch, and an enable input coupled to the clock enable output of the second latch.

In one embodiment of the first aspect, the first latch is not in a data propagation path between the first scan enable terminal and the clock input of the second scan latch, and the second latch is not in a data propagation path between the first scan enable terminal and the clock input of the first scan latch.

Another embodiment of the first aspect includes the device having a second scan chain having a second plurality of scan latches including a third scan latch and a fourth scan latch, the scan enable input of each scan latch of the second plurality of scan latches coupled to a second scan enable terminal, the third scan latch being downstream from the fourth scan latch. A second clock terminal coupled to provide an ungated clock signal to the clock inputs a first portion of the first scan chain. And a second clock suppression circuit having a clock input coupled to the second clock terminal to receive the ungated clock signal from the second terminal; a second inverter having an input coupled to the second scan enable terminal, and an output; a third latch having a data input coupled to the output of the second inverter, a clock input coupled to the second clock terminal to receive the ungated clock signal, and a clock enable output; a fourth latch having a data input coupled to the input of the inverter, a clock input coupled to the second clock terminal to receive the ungated clock signal, and a clock enable output; a third clock gate having a clock input coupled to the second clock terminal to receive the ungated clock, a clock output coupled to the clock input of the third latch, and an enable input coupled to the clock enable output of the third latch; and a fourth clock gate having a clock input coupled to the second clock terminal to receive the ungated clock, a clock output coupled to the clock input of the fourth latch, and an enable input coupled to the clock enable output of the fourth latch.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures. For example, it will be appreciated that LBIST testing of the logic portions 120, 130, and 140 can occur concurrently or separately from each other through the use of separate dedicated LBIST interconnects. Also, it will be appreciated that the clock suppression techniques described herein can be used relative to false combinational logic paths in the same manner as described herein for multi-cycle combinational logic paths.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. For example, it will be appreciated that the clock gate can be implemented using transmission gate, a logic gate, and the like.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
providing a first clock signal having a plurality of pulses, including a first set of pulses having a first period, followed by a first launch pulse having a second period that is different than the first period, followed by a first capture pulse having a third period, followed a second set clock pulses having the first period;
shifting a first scan test vector into a first scan chain based on the first set of pulses;
suppressing the first launch pulse of the first set of pulses to a first latch of the first scan chain;
providing the first launch pulse of the first set of pulses to a second latch, a third latch, and a fourth latch of the first scan chain, wherein the second latch is functionally downstream from the first latch, and the fourth latch is functionally downstream from the third latch;
suppressing the first capture pulse of the first set of pulses to the fourth latch;
providing the first capture pulse of the first set of pulses to the first latch, the second latch and the third latch; and shifting a scan result vector from the first scan chain, after suppressing the first capture pulse, based on the second set of pulses.

2. The method of claim 1, wherein the second period is shorter than the first period.

3. The method of claim 1, wherein the first period and the third period of the first pulse are the same, and the second period is shorter than the first and third period.

4. The method of claim 3 further comprising:
analyzing the scan result vector to determine whether a scan chain failure has occurred.

5. The method of claim 4, wherein analyzing includes generating a result signature based upon the plurality of scan result bits, and comparing the result signature to an expect signature.

6. The method of claim 5, further including performing the analyzing on a semiconductor die that includes the first scan chain.

7. The method of claim 1, wherein shifting the first scan test vector includes selecting a scan input of each latch of the first scan chain during the shifting by asserting a scan data enable signal.

8. The method of claim 7 wherein suppressing the first launch pulse and suppressing first capture pulse is in response to maintaining the scan data enable signal being in a negated state during the first launch pulse and the first capture pulse.

9. The method of claim 8, further comprising:
selecting an application data input of each latch of the first scan chain while providing the first launch pulse and the first capture pulse in response to negating the shift scan data enable signal.

10. The method of claim 8 further comprising providing an asserted test enable signal during the plurality of pulses.

11. A device comprising:
a first scan chain having a first plurality of scan latches, each scan latch of the first scan chain including a scan enable input, an application data input, a scan data input, a clock input, and a data output, the scan enable input of each scan latch of the first scan chain connected to a first scan enable terminal; and
a first clock suppression circuit having
a scan enable input coupled to the first scan enable terminal,
a first output coupled to the clock input of a first scan latch of the first scan chain to suppress an initial clock pulse at the clock input of the first scan latch after a scan enable signal at the first scan enable terminal is negated, and to allow a next clock pulse, after the initial clock pulse, to occur at the clock input of the first scan latch, and
a second output coupled to the clock input of a second scan latch of the first scan chain to allow the initial clock pulse at the clock input of second scan latch after a scan enable signal at the scan enable input is negated, and to suppress the next clock pulse at the clock input of the second scan latch.

12. The device of claim 11 further comprising:
a second scan chain having a second plurality of scan latches, each scan latch of the second scan chain including a scan enable input, an application data input, a scan data input, a clock input, and a data output, the scan enable input of each scan latch of the second scan chain connected to a second scan enable terminal; and
a second clock suppression circuit having
a scan enable input coupled to the second the scan enable terminal,
a first output coupled to the clock input of a first scan latch of the second scan chain to suppress an initial clock pulse at the clock input of the first scan latch after a scan enable signal at the second scan enable terminal is negated, and to allow a next clock pulse, after the initial clock pulse, to occur at the clock input of the first scan latch of the second scan chain, and
a second output coupled to the clock input of a second scan latch of the second scan chain to allow the initial clock pulse at the clock input of a second scan latch of the second scan chain after a scan enable signal at the second scan enable input is negated, and to suppress the next clock pulse at the clock input of the second scan latch of the second scan chain.

13. The device of claim 11, wherein the clock suppression circuit further includes a test enable input, and the initial clock pulse is further allowed and suppressed at the first and second scan latches of the first scan chain, respectively, and the next clock pulse is further suppressed and allowed at the first and second scan latches of the first scan chain, respectively in response to the test enable signal being asserted while the first scan enable input is negated.

14. The device of claim 11, wherein the duration between the first launch pulse and the first capture pulse defines a worst-case propagation delay of an at-speed test of a combinational logic portion of the first scan chain.

15. The device of claim 11 further comprising:
built-in self test circuitry to generate a shift clock signal having a first plurality of pulses with a first period that are used to shift predefined test data into the first scan chain, followed by the initial clock pulse having a second period and the next pulse having a third period that generate a test result at the scan chain, followed by a second plurality of pulses with the third period that are used to shift test result data from the scan chain, the second period being shorter than the first period and the third period.

16. The device of claim 15, wherein the built-in self-test circuitry further includes analyzer circuitry that receives the test result data to determine whether the result data meets an expected criteria.

17. The device of claim 15, wherein the second period provided by the built-in self-test circuitry is shorter than the third period.

18. A device comprising:
a first scan chain having a first plurality of scan latches including a first scan latch and a second scan latch, each scan latch including a scan enable input, an application data input, a scan data input, a clock input, and a data output, the scan enable input of each scan latch of the first plurality of scan latches coupled to a first scan enable terminal, the second scan latch being downstream from the first scan latch;
a first clock terminal coupled to provide an ungated clock signal to the clock inputs a first portion of the first scan chain; and
a first clock suppression circuit having
a clock input coupled to the first clock terminal to receive the ungated clock signal;
a first inverter having an input coupled to the scan enable terminal, and an output;
a first latch having a data input coupled to the output of the first inverter, a clock input coupled to the first clock terminal to receive the ungated clock signal, and a clock enable output;

a second latch having a data input coupled to the input of the first inverter, a clock input coupled to the first clock terminal to receive the ungated clock signal, and a clock enable output;

a first clock gate having a clock input coupled to the first clock terminal to receive the ungated clock, a clock output coupled to the clock input of the first latch, and an enable input coupled to the first clock enable output of the first latch; and a second clock gate having a clock input coupled to the first clock terminal to receive the ungated clock, a clock output coupled to the clock input of the second latch, and an enable input coupled to the clock enable output of the second latch.

19. The device of claim 18, wherein the first latch is not in a data propagation path between the first scan enable terminal and the clock input of the second scan latch, and the second latch is not in a data propagation path between the first scan enable terminal and the clock input of the first scan latch.

20. The device of claim 18 further comprising:

a second scan chain having a second plurality of scan latches including a third scan latch and a fourth scan latch, the scan enable input of each scan latch of the second plurality of scan latches coupled to a second scan enable terminal, the third scan latch being downstream from the fourth scan latch;

a second clock terminal coupled to provide an ungated clock signal to the clock inputs a first portion of the first scan chain; and a second clock suppression circuit having a clock input coupled to the second clock terminal to receive the ungated clock signal from the second terminal;

a second inverter having an input coupled to the second scan enable terminal, and an output;

a third latch having a data input coupled to the output of the second inverter, a clock input coupled to the second clock terminal to receive the ungated clock signal, and a clock enable output;

a fourth latch having a data input coupled to the input of the inverter, a clock input coupled to the second clock terminal to receive the ungated clock signal, and a clock enable output;

a third clock gate having a clock input coupled to the second clock terminal to receive the ungated clock, a clock output coupled to the clock input of the third latch, and an enable input coupled to the clock enable output of the third latch; and a fourth clock gate having a clock input coupled to the second clock terminal to receive the ungated clock, a clock output coupled to the clock input of the fourth latch, and an enable input coupled to the clock enable output of the fourth latch.

* * * * *